United States Patent
Aakalu et al.

[11] Patent Number: 5,953,207
[45] Date of Patent: Sep. 14, 1999

[54] THERMALLY CONDUCTIVE ENCLOSURE FOR A BATTERY

[75] Inventors: Nandakumar G. Aakalu, Suffern; Jinchul D. Park, Cresskill; Alexander Petrunia, Madison; Daniel Plaza, Mendham, all of N.J.

[73] Assignee: Lucent Technologies, Inc., Murray Hill, N.J.

[21] Appl. No.: 09/109,255

[22] Filed: Jun. 3, 1998

[51] Int. Cl.[6] ...................................... H05K 7/20
[52] U.S. Cl. ..................... 361/690; 361/692; 361/694; 361/695; 361/704; 165/80.3; 165/185; 312/223.2; 454/184
[58] Field of Search .................... 361/688, 690, 361/692, 694, 704, 724; 312/223.1, 223.2; 454/184

[56] References Cited

U.S. PATENT DOCUMENTS

| | | | |
|---|---|---|---|
| 4,880,145 | 11/1989 | McManus | 222/192 |
| 5,469,328 | 11/1995 | Palaszewski | 361/690 |
| 5,590,026 | 12/1996 | Warren et al. | 361/704 |
| 5,781,410 | 7/1998 | Keown et al. | 361/690 |
| 5,812,373 | 9/1998 | Hwang | 361/704 |

*Primary Examiner*—Leo P. Picard
*Assistant Examiner*—Boris L. Chervinsky

[57] ABSTRACT

An enclosure according to this invention comprises a thermally conductive wall mountable to a heat source. The enclosure is mounted such that heat transfers from the heat source to the thermally conductive wall. A bracket holds the item to be heated to at least one of the walls of the enclosure, such that the item is warmed by thermal conduction. A thermal pad may be interposed between the item and the mounting wall and, likewise, between the enclosure and the heat source. By this structure, heat is passed from the heat source to the enclosure and then to the item.

15 Claims, 4 Drawing Sheets

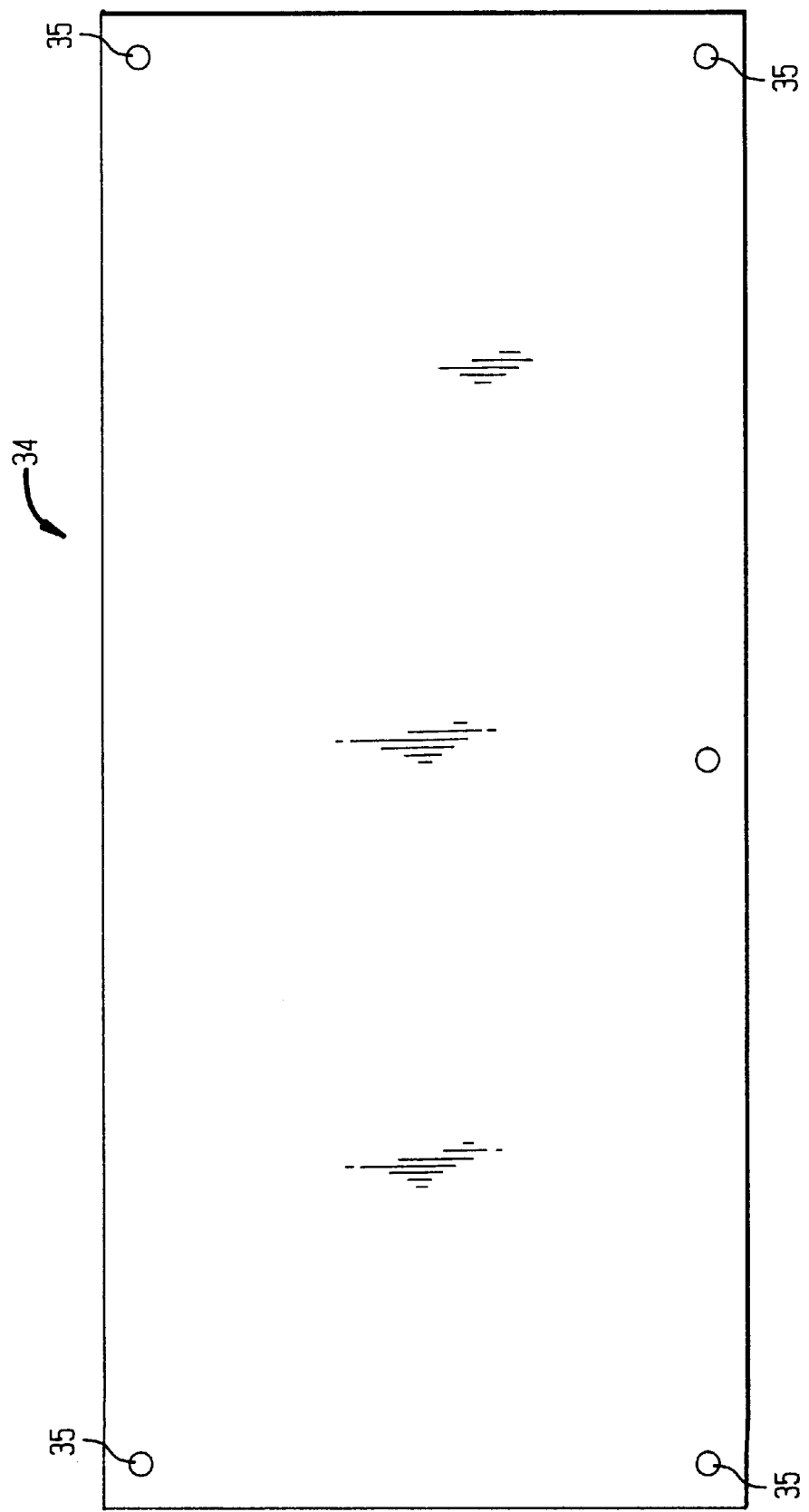

THERMALLY CONDUCTIVE ENCLOSURE FOR A BATTERY

CROSS REFERENCE TO RELATED APPLICATIONS

This application is related to copending U.S. patent application Ser. No. 09/008726, entitled "Heat Dissipating Structure For An Electrical Assembly," filed on Jan. 19, 1998, having the same assignee.

FIELD OF THE INVENTION

This invention relates generally to an enclosure for a battery, and more particularly to a thermally conductive enclosure for a battery.

BACKGROUND

A base station for a cellular telephone system uses expensive, environmentally sensitive electronics. Typically mounted outdoors, base stations are exposed to extreme weather conditions, including harshly cold or warm temperatures. A weather resistant enclosure is often used to protect the base station electronics from the environment. It is known to provide an outer cover or solar shield to such an enclosure, which is beneficial in sheltering the enclosure from solar heat. A solar shield, however, can impede the dissipation of heat from the base station.

A base station also requires a constant source of electrical power to maintain operation. Since electric power outages are undesired, back-up power supplies, like lead acid batteries, are used to ensure continuous power to the electronics. Should the primary power supply fail, the battery powers the electronics for a given time. A lead acid battery, however, only operates in a limited temperature range. If a battery falls below 20 degrees centigrade, its output is drastically reduced. Similarly, a battery exposed to extreme warmth will have its useful life drastically shortened. It is therefore desirable to maintain battery temperature below 65 degrees centigrade.

To protect base station electronics and batteries from high temperatures, base stations are provided with heat dissipating structures. It is known to provide a heat sink, including thermally conductive fins, on the base station enclosure and under the solar shield for dissipating heat generated within the enclosure. The fins typically define vertical channels which act as chimneys, allowing heated air to rise and escape through an opening at the top of the solar shield. As the enclosure is cooled, so is the battery.

To protect against battery failure due to low temperature, base stations manufactured for use in cold environments are often equipped with in electric heater dedicated to the battery. It is known in the art to mount the battery in direct physical contact with the heater and to enclose the battery, battery heater and base station electronics in the base station enclosure. If the temperature within the enclosure falls below a certain threshold, electric power is delivered to the heater, thereby heating the battery.

There are several disadvantages in using a dedicated electric heater to heat a battery within a base station enclosure. Electric heaters are expensive and occupy space within the enclosure, increasing the cost of the assembly. Since the heater must be powered, system design must account for the power drawn when the heater is active. For instance, base stations using an electric heater for the battery must be equipped with components, such as circuit breakers, capable of handling increased loads to accommodate the current drawn by the battery heater. Batteries in contact with electric heaters also place the electronics at risk. If an electric heater in direct contact with a battery short circuits, or if the heater control fails, the battery will overheat. It is known for an overheated battery to leak acid. In a cellular base station, an acid leak may damage or destroy expensive electronics, create a fire hazard or cause the release of dangerous gases.

Eliminating the use of an electric heater to heat a battery in a cellular system base station is highly desirable. Removing the heater and associated structures from the base station enclosure conserves space. The risks associated with loss of heater control, such as an acid leak, are substantially eliminated. Power system components, like circuit breakers, need not account for battery heater loads. There is a need, therefore, for a battery enclosure which will maintain the operating temperature of a lead acid battery without use of a dedicated electric heater.

SUMMARY OF THE INVENTION

An enclosure according to this invention comprises a thermally conductive wall mountable to a heat source. The heat source is preferably an electronic assembly, like a cellular base station, which generates heat during operation. The enclosure is mounted such that heat flows by conduction from the heat source to the thermally conductive wall. The remaining walls of the enclosure may also be thermally conductive. A bracket holds the item to be heated to one of the walls, such that the item is warmed by thermal conduction. A thermal pad may be interposed between the item and the mounting wall, and, likewise, between the enclosure and the heat source, to further enhance thermal conduction. By this structure, heat is passed from the heat source to the enclosure and then to the item.

In one embodiment, the invention is directed to an enclosure for a battery. All the walls comprising the enclosure are made from a thermally conductive material, such as aluminum or steel. The enclosure is vented through air holes, allowing hydrogen generated by the battery to escape the enclosure to the outside air. Since it is desirable for the enclosure to remain substantially weather tight, a membrane which is impervious to water, but which passes air and hydrogen, covers the vent holes. A bracket mountable to one of the walls holds the battery to the wall, and a thermally conductive pad is interposed between the wall and the battery. If the heat source is an electronic assembly, such as a cellular base station, a thermally conductive pad is also interposed between the battery enclosure and the base station enclosure.

In one embodiment, structure is also provided to dissipate heat in the extreme warmth condition. The battery enclosure is mountable to the bottom exterior of the base station enclosure. Air flowing over the structure tends to cool it during times of warm temperatures. Air flow is improved by fans mounted to the base station enclosure and oriented to draw air vertically downwardly between the base station enclosure and the solar shield. This creates air flow around the battery enclosure.

This structure advantageously maintains the operating temperature of the battery without use of a dedicated electric heater, even in harshly cold environments. The risk of overheating the battery due to loss of heater control is substantially eliminated. Space is conserved within the electronics enclosure and the cost of a dedicated battery is reduced or eliminated. By separating the battery enclosure from the electronics enclosure, the electronics enclosure can be air tight and need not vent hydrogen gas. Also, power system design need not accommodate the current draw of a full-on battery heater, potentially reducing the cost of the overall system design.

BRIEF DESCRIPTION OF THE DRAWINGS

FIG. 2 is a view showing a cover for the enclosure of FIG. 1;

DETAILED DESCRIPTION

Figure 1:
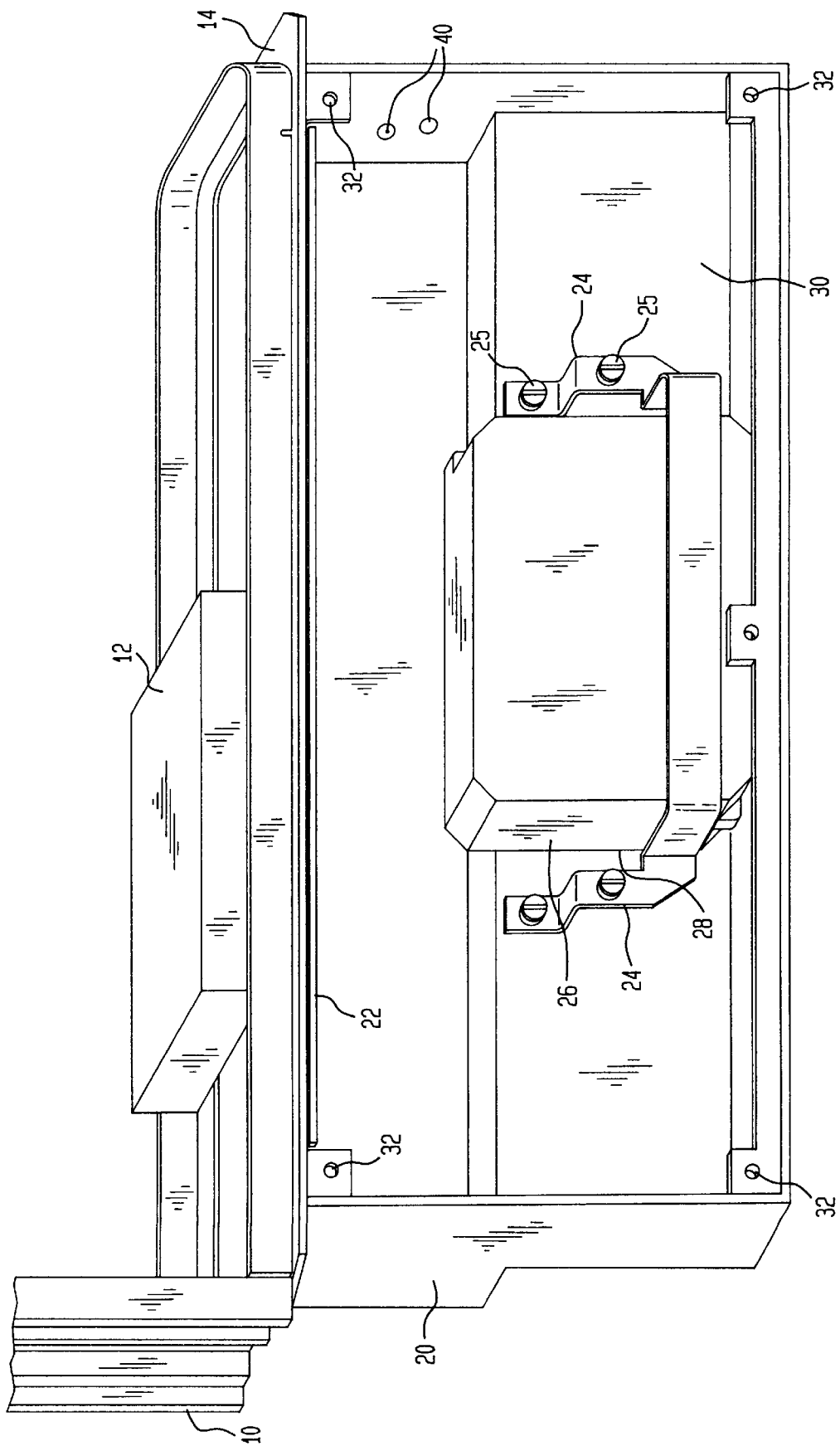
FIG. 1 is a perspective view showing an enclosure without a cover in accordance with the present invention.

Referring now to the drawings, FIG. 1 shows an enclosure 20 according to the principles of the present invention. The enclosure 20 is removably mounted in thermally conductive relation to electrical assembly enclosure 10 which contains a heat source 12. An item to be heated, such as battery 26, is held in thermally conductive relation to a thermally conductive wall 30 by bracket 24. The heat source 12 transfers heat by conduction to thermally conductive wall 22. Heat is then transferred to thermally conductive wall 30 and to the battery 26. A covering wall, shown in FIG. 2, is removably mounted by screws or bolts to enclosure 20 through holes 32 to configure a substantially weather tight enclosure.

In a preferred embodiment, heat source 12 is an electrical assembly such as a base station for a cellular system. The base station electronics are housed in electrical assembly enclosure 10, and generate heat during operation. The electrical assembly enclosure 10 is made from a thermally conductive material such as aluminum or steel. Heat from the operating electronics is transferred by conduction to enclosure 20 which is held in a thermally conductive relation with electrical assembly enclosure 10 at wall 22. A thermally conductive pad 14 interposed between enclosure 10 and wall 22 enhances thermal conduction. Wall 22 is also made from a substantially thermal conductive material such as aluminum or steel.

Still referring to FIG. 1, battery 26 is removably mounted with bracket assembly 24. Bolts 25 hold bracket assembly 24 to wall 30. Battery 26 is interposed between the bracket assembly 24 and wall 30 in thermally conductive relation to wall 30. A thermally conductive pad (not shown) interposed at the interface 28 of battery 26 and wall 30 aids thermal conduction. Heat is transferred by conduction from wall 22 to wall 30, which is made from a thermally conductive material such as aluminum or steel, and then to battery 26 through the thermally conductive pad (not shown). Vent holes 40 provide air flow from the interior of enclosure 20 to the outside air. A material which is substantially impervious to water but through which air passes covers holes 40.

A covering wall 34 is shown in FIG. 2. The covering wall 34, which may be made from thermally conductive material such as aluminum or steel, is configured to mount on enclosure 20 to enclose battery 26. Holes 35 are configured to accept bolts or screws (not shown) for mounting through holes 32 of enclosure 20, although other mounting means would be apparent to one with ordinary skill in the art. In a preferred embodiment, the covering wall 34 is mounted to form a substantially weather tight enclosure.

Figure 3B:
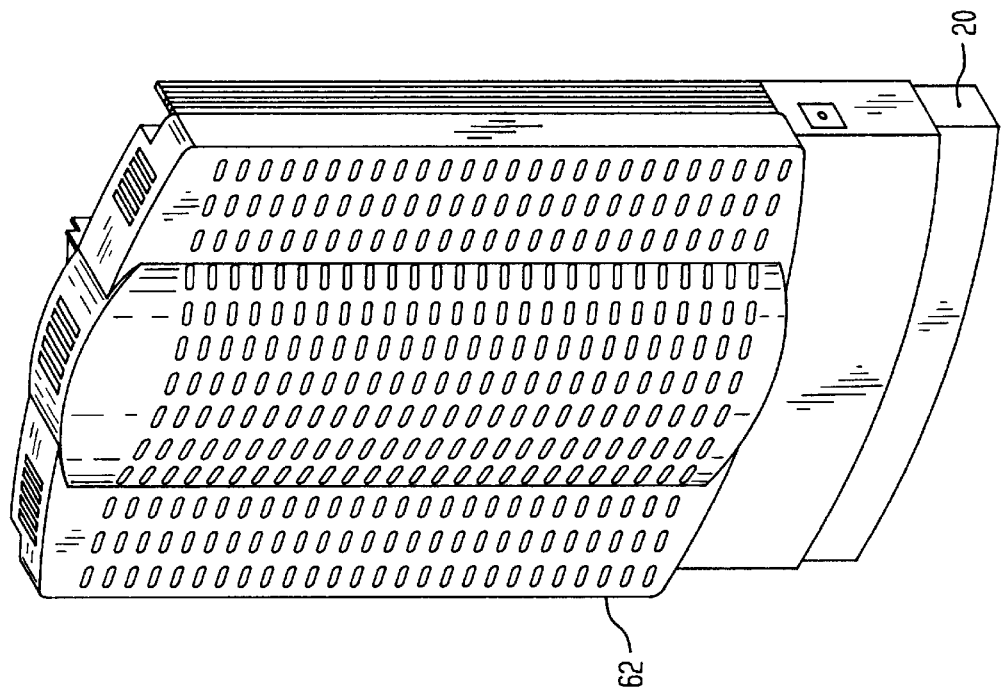
FIG. 3B is a perspective view showing an enclosure mounted to a heat source with a cover; and, FIG. 4 is a side view depicting air currents according to the present invention.
Figure 3A:
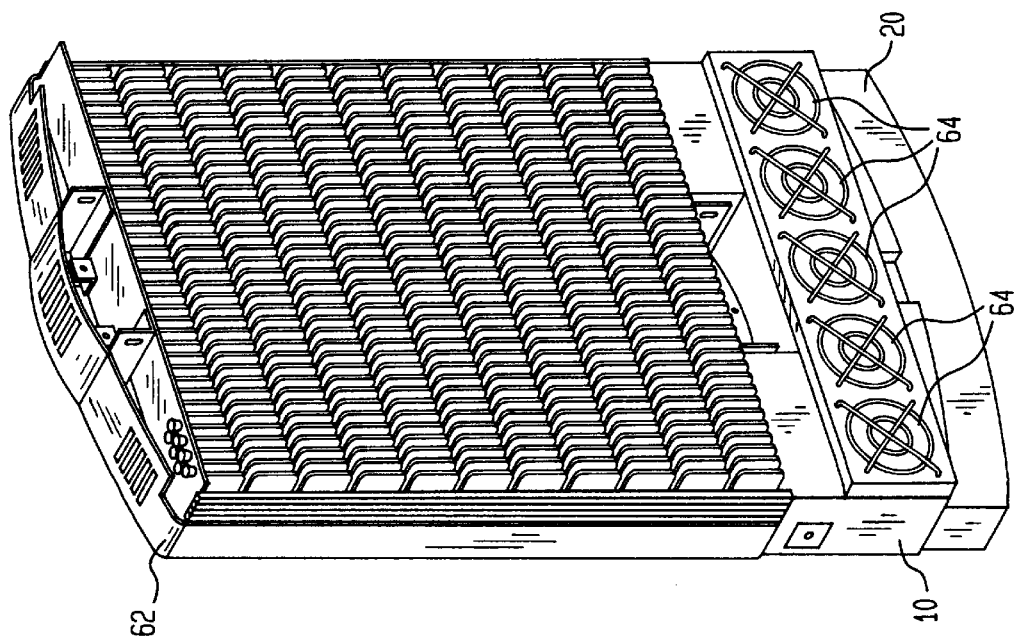
FIG. 3A is a perspective view showing an enclosure mounted to a heat source.

An enclosure 20 according to the present invention mounted to an enclosed heat source is shown in FIG. 3A and FIG. 3B. In the preferred embodiment, the heat source is an electrical assembly enclosed in an electrical assembly enclosure 10, such as in a cellular system base station. For details concerning such a structure, refer to copending U.S. patent application Ser. No. 09/008726, entitled "Heat Dissipating Structure For An Electrical Assembly," filed on Jan. 19, 1998, having the same assignee. A cover 62 is mounted over the electrical assembly enclosure 10 such that an air gap exists between cover 62 and the electrical assembly enclosure 10. Fans 64 are mounted at the base of electrical assembly enclosure 10. Cover 62 is imperforate on the side of the electrical assembly enclosure 10 having the fans 64. Enclosure 20 is mounted to the bottom of electrical assembly enclosure 10. Fans 64 draw air into the air gap between cover 62 and electrical assembly enclosure 10. Air is drawn by fans 64 in order to create a low pressure condition around enclosure 20. Due to this low pressure condition, air flows around enclosure 20, and heat is thereby dissipated.

Figure 4:
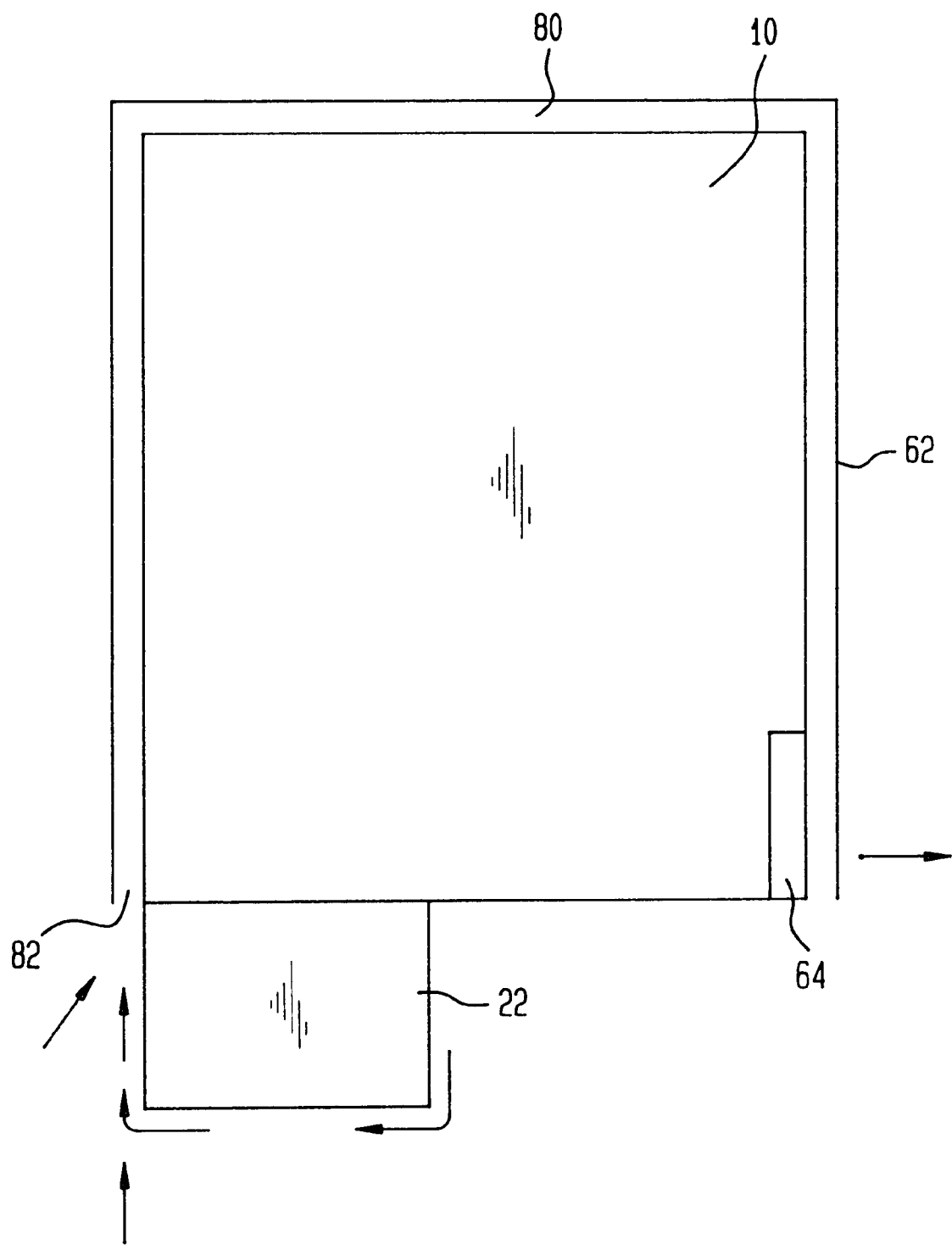

The aforedescribed air flow action is diagramatically shown from a side view in FIG. 4. Fan 64 is shown mounted at the bottom of electrical assembly enclosure 10. Cover 62 is mounted to electrical assembly enclosure 10 such that an air gap 80 and an aperture 82 are defined between the cover 62 and electrical assembly enclosure 10. In a preferred embodiment, cover 62 is imperforate allowing air to be drawn into air gap 80, and fan 64 is operable to create an air flow substantially away from cover 62. The resulting air flow creates a low pressure condition at aperture 82 and cool air flows into air gap 80. By this action, a low pressure condition also exists substantially around enclosure 20. As air passes over enclosure 20 into aperture 82, heat is dissipated from the enclosure 20.

An enclosure has been disclosed for heating an item, such as a battery, by thermal conduction. While exemplary embodiments of the present invention have been disclosed, it is understood that various modifications and adaptations to the disclosed embodiments will be apparent to those of ordinary skill in the art and it is intended that this invention include all such embodiments.

What is claimed is:

1. A thermally conductive enclosure for an item, said enclosure being removably attachable to a heat source, comprising:

a plurality of walls configured to enclose said item, at least one wall being a substantially thermally conductive wall having a mounting surface configured to removably attach to said heat source, said substantially thermally conductive wall positioned in thermally conductive relation with said heat source, said heat source positioned external to said item; and a bracket assembly removably mountable to at least one thermally conductive wall, said bracket assembly holding said item to said thermally conductive wall in a thermally conductive relation, wherein said item is enclosed within said thermally conductive enclosure.

2. The enclosure of claim 1 wherein said item comprises a battery.

3. The enclosure of claim 1 wherein said heat source comprises an electrical assembly, the assembly being contained within an electrical assembly enclosure.

4. The enclosure of claim 3 wherein said electrical assembly is a base station for wireless communication.

5. The enclosure of claim 1 wherein said thermally conductive walls are substantially aluminum.

6. The enclosure of claim 1 wherein said thermally conductive walls are substantially steel.

7. The enclosure of claim 1 wherein said enclosure is substantially weather tight.

8. The enclosure of claim 1 wherein at least one wall defines at least one hole, said hole having a membrane substantially impervious to water, wherein said thermally conductive enclosure is vented to the air.

9. The enclosure of claim 1 wherein said thermally conductive wall is in direct physical contact with said heat source.

10. The enclosure of claim 1 further comprising a resilient thermally conductive pad interposed between said heat source and said thermally conductive wall.

11. The enclosure of claim 1 wherein said item is in direct physical contact with at least one said thermally conductive wall.

12. The enclosure of claim 1 further comprising a resilient thermally conductive pad interposed between said item and said thermally conductive wall.

13. The enclosure of claim 3 further comprising structure for dissipating heat from said enclosure, said structure comprising:

a perforated cover spaced from said electrical assembly enclosure, said perforated cover and said electrical assembly enclosure defining an air gap substantially around said electrical assembly enclosure; and, a fan mounted to one of said electrical assembly enclosure and said perforated cover, said fan being oriented to draw air into said air gap, wherein an orientation of the thermally conductive enclosure permits air drawn into said air gap to flow substantially around said thermally conductive enclosure.

14. A structure for controlling temperature of a battery in a base station for wireless communication, comprising, a heat dissipating electrical assembly;

an electrical assembly enclosure for enclosing said electrical assembly, said electrical assembly enclosure being in thermally conductive relation with said electrical assembly;

a perforated cover spaced from said electrical assembly enclosure, said perforated cover and said electrical assembly enclosure defining an air gap substantially around said electrical assembly enclosure;

a plurality of walls configured to enclose said battery, at least one wall being a substantially thermally conductive wall having a mounting surface configured to removably attach to said electrical assembly enclosure, said substantially thermally conductive wall positioned in thermally conductive relation with said electrical assembly enclosure, said electrical assembly enclosure positioned external to said battery;

a bracket assembly removably mountable to at least one thermally conductive wall, said bracket assembly holding said battery to said thermally conductive wall in a thermally conductive relation, wherein said battery is enclosed within said thermally conductive enclosure; and, a fan mounted to one of said electrical assembly enclosure and said perforated cover, said fan being oriented to draw air into said air gap, wherein an orientation of the thermally conductive enclosure permits air drawn into said air gap to flow substantially around said thermally conductive enclosure.

15. The structure of claim 14 wherein said electrical assembly enclosure is air tight.

* * * * *